(12) United States Patent
Enoki et al.

(10) Patent No.: US 6,410,677 B1
(45) Date of Patent: Jun. 25, 2002

(54) RESIN COMPOSITION FOR INSULATING MATERIAL, AND INSULATING MATERIAL PRODUCED FROM SAID RESIN COMPOSITION

(75) Inventors: Takashi Enoki, Yokohama; Nobuhiro Higashida, Kawasaki; Mitsuru Murata, Yokohama, all of (JP)

(73) Assignee: Sumitomo Bakelite Company Limited, Tokyo (JP)

( * ) Notice: Subject to any disclaimer, the term of this patent is extended or adjusted under 35 U.S.C. 154(b) by 0 days.

(21) Appl. No.: 09/670,867

(22) Filed: Sep. 27, 2000

(30) Foreign Application Priority Data

Sep. 28, 1999 (JP) ............................. 11-275323

(51) Int. Cl.[7] ........................ C08G 73/00; C08G 73/12; C08G 73/22
(52) U.S. Cl. ...................... 528/170; 528/327; 528/353; 524/600; 524/602; 524/606; 525/422
(58) Field of Search ................. 528/353, 170, 528/327; 525/422; 524/600, 602, 606

(56) References Cited

U.S. PATENT DOCUMENTS

| | | | | |
|---|---|---|---|---|
| 4,454,276 A | * | 6/1984 | Uda et al. | 524/209 |
| 4,551,522 A | * | 11/1985 | Fryd et al. | 528/351 |
| 4,622,285 A | * | 11/1986 | Ahne | 430/322 |
| 4,760,126 A | * | 7/1988 | Numata et al. | 528/353 |
| 5,240,819 A | * | 8/1993 | Mueller et al. | 430/326 |
| 5,340,684 A | * | 8/1994 | Hayase et al. | 430/165 |
| 5,585,217 A | * | 12/1996 | Oba | 430/191 |
| 5,753,407 A | * | 5/1998 | Oba | 430/191 |
| 5,891,986 A | * | 4/1999 | Yamaguchi et al. | 528/353 |
| 6,159,654 A | * | 12/2000 | Machida et al. | 430/270.1 |

OTHER PUBLICATIONS

"A Neutral Templating Route to Mesoporous Molecular Sieves", Science, vol. 267; pp. 865–867.
"Templating of Mesoporous Molecular Sieves by Nonionic Polyethylene Oxide Surfactants", Science, vol. 269; Sep. 1995; pp. 1242–1244.

* cited by examiner

*Primary Examiner*—P. Hampton-Hightower
(74) *Attorney, Agent, or Firm*—Smith, Gambrell & Russell LLP

(57) ABSTRACT

The present invention provides an insulating material showing excellent thermal propeties and electrical properties in semiconductor applications. That is, the present invention provides: a resin composition for insulating material, comprising, as essential components: (A) a compound having an amphiphatic property, and (B) a heat-resistant resin having a glass transition temperature higher than thermal decomposition temperature of the compound (A), or a precursor thereof; and an insulating material produced by a process which comprises steps of; allowing, in the above resin composition for insulating material, the compound (A) and the heat-resistance resin or the precursor thereof (B) to form a structure of separated phases, and then heat-treating the resulting resin composition at a temperature higher than thermal decomposition temperature of the compound (A) but lower than glass transition temperature of the heat-resistant resin (B) or the heat-resistant resin obtained by ring closure of the precursor thereof.

7 Claims, No Drawings

RESIN COMPOSITION FOR INSULATING MATERIAL, AND INSULATING MATERIAL PRODUCED FROM SAID RESIN COMPOSITION

FIELD OF THE INVENTION

The present invention relates to an insulating material. More particularly, the present invention relates to a resin composition for insulating material and an insulating material produced therefrom, both showing excellent properties when used in electrical or electronic appliances or in semiconductor devices.

DESCRIPTION OF RELATED ART

Of the properties to be possessed by materials used in electrical or electronic appliances or semiconductor devices, electrical properties and heat resistance are most important. As circuits have become finer and signal transmittance has become faster in recent years, an insulating material of low dielectric constant is required, in particular. As an insulating material satisfying both electrical properties and heat resistance, an insulating material using a heat-resistant resin is expected. Conventional inorganic insulating materials such as silicon dioxide and the like show high heat resistance but have a high dielectric constant, and are becoming more and more insufficient in electrical properties and heat resistance because the requirements of insulating material for these properties are becoming increasingly higher. Heat-resistant resins represented by a polyimide resin are superior in and satisfy electrical properties and heat resistance and are actually in use as a cover lay for printed circuit, a passivation film of semiconductor device, etc.

As a semiconductor has come to possess a higher function and a higher performance in recent years, significant improvement in electrical properties and heat resistance has become necessary and a resin of higher performance has come to be required. In particular, a low-dielectric constant material having a dielectric constant lower than 2.5 is expected. Conventional insulating materials, however, do not possess the required properties. Under such a situation, it was hitherto attempted to obtain an insulating material of reduced dielectric constant, for example, by adding, to a resin composition comprising a polyimide and a solvent, a thermally decomposable resin other than polyimides and thermally decomposing the resin to form pores. However, when a heat-resistant resin such as polyimide or the like and a thermally decomposable resin are compatible with each other, the heat-resistant resin shows a reduced glass transition temperature; consequently, when the thermally decomposable resin is decomposed to form pores, the pores formed are collapsed and little reduction in dielectric constant is achieved. Meanwhile, when a thermally decomposable resin not compatible with the heat-resistant resin such as polyimide or the like is used, the structure of separated phases of the two resins is too large and unusable as an insulating material for wiring in semiconductor.

OBJECT AND SUMMARY OF THE INVENTION

The present invention aims at providing a resin composition for insulating material and an insulating material produced therefrom, both showing a very low dielectric constant, good insulating property and excellent heat resistance.

The present inventors made an extensive study in view of the above-mentioned problems of the prior art. As a result, the present invention has been completed as follows.

According to the present invention, there are provided a resin composition for insulating material and an insulating material, as described in the following items 1 to 4.

1. A resin composition for insulating material, comprising, as essential components:
   (A) a compound having an amphipathic property, and
   (B) a heat-resistant resin having a glass transition temperature higher than thermal decomposition temperature of the compound (A), or a precursor thereof.
2. A resin composition for insulating material according to the above item 1, wherein the heat-resistant resin or the precursor thereof (B) is a polyimide resin or a polyimide precursor.
3. A resin composition for insulating material according to the above item 1, wherein the heat-resistant resin or the precursor thereof (B) is a polybenzoxazole resin or a polybenzoxazole precursor.
4. An insulating material produced by a process which comprises steps of:
   allowing, in the resin composition for insulating material as set forth in any of the above items 1 to 3, the compound (A) and the heat-resistant resin or the precursor thereof (B) to form a structure of separated phases, and then
   heat-treating the resulting resin composition at a temperature higher than thermal decomposition temperature of the compound (A) but lower than glass transition temperature of the heat-resistant resin (B) or the heat-resistant resin obtained by ring closure of the precursor thereof.

DETAILED DESCRIPTION OF THE INVENTION

The resin composition for insulating material according to the present invention comprises, as essential components:
(A) a compound having an amphipathic property, and
(B) a heat-resistant resin having a glass transition temperature higher than thermal decomposition temperature of the compound (A), or a heat-resistant resin precursor capable of forming the heat-resistant resin by thermal reaction or chemical ring closure.

The resin composition for insulating material according to the present invention can be made into an insulating material by coating it on a substrate or the like and heating the coated substrate to form a film on the substrate, or by impregnating the present resin composition into a glass cloth or the like, followed by heating. In the initial stage of this heating, the solvent used for coating or impregnation is evaporated; thereby, the compound (A) is concentrated to form a micelle structure and give rise to phase separation against the heat-resistant resin or precursor thereof (B); as a result, the heat-resistant resin or the heat-resistant resin obtained by ring closure of the precursor thereof can exhibit its own high glass transition temperature. By raising the heating temperature to a temperature which is higher than thermal decomposition temperature of the compound (A) but lower than glass transition temperature of the heat-resistant resin (B), the compound (A) is thermally decomposed and evaporated before the glass transition temperature of the component (B) is reached, whereby fine pores are formed. Thus, an insulating material of low dielectric constant can be obtained.

The component (A) having an amphipathic property, used in the present invention can be any compound as long as it can, in the initial stage of the heating applied for converting the present resin composition into an insulating material, be concentrated owing to the evaporation of the solvent used, to form a micelle structure and give rise to phase separation against the component (B). As specific examples of the component (A), there are mentioned anionic surfactants such as carboxylic acid salt (e.g. aliphatic soap, N-acylamino acid or salt thereof, polyoxyethylenecarboxylic acid salt, polyoxyethylene alkyl ether carboxylic acid salt, or acylated peptide), sulfonic acid salt (e.g. alkylsulfonic acid salt, alkylbenzene- or alkylnaphthalene-sulfonic acid salt, naphthalenesulfonic acid salt (Na, K, Li, Ca or other salt)/formalin polycondensate, melaminesulfonic acid salt (Na, Ca or other salt)/formalin polycondensate, dialkylsulfosuccinic acid salt, sulfosuccinic acid alkyl disalt, polyoxyethylene alkylsulfosuccinic acid disalt, alkylsulfoacetic acid salt, α-olefinsulfonic acid salt, N-acyl-N-methyltaurine salt, dimethyl-5-sulfoisophthalate sodium salt, or acylsulfonic acid salt), sulfuric acid ester salt (e.g. sulfonated oil, higher alcohol sulfuric acid ester salt, secondary higher alcohol sulfuric acid ester salt, polyoxyethylene alkyl ether sulfate salt, secondary or higher alcohol ethoxysulfate, polyoxyethylene alkylphenyl ether sulfate salt, monogly sulfate, aliphatic alkylolamide sulfuric acid ester salt, polyoxyethylene alkyl allyl ether sulfate salt, or alkylamide sulfate salt), phosphoric acid ester salt (e.g. alkyl phosphate salt, polyoxyethylene alkyl ether phosphate salt or polyoxyethylene alkyl allyl ether phosphate salt) and the like; cationic surfactants such as aliphatic amine salt, aliphatic quaternary ammonium salt, benzalkonium chloride salt, benzethonium chloride, pyridinium salt, imidazolinium salt and the like; ampholytic surfactants such as betaine, amidobetaine, carboxybetaine, aminocarboxylic acid salt, imidazolinium betaine, lecithin, alkylamine oxide (e.g. dimethyllaurylamine oxide, dimethylstearylamine oxide or dihydroxyethyllaurylamine oxide) and the like; ether type nonionic surfactants such as polyoxyethylene alkyl ether, polyoxyethylene olein ether, polyoxyethylene secondary alcohol ether, polyoxyethylene alkyl phenyl ether, polyoxyethylene nonylphenol, polyoxyethylene sterol ether, polyoxyethylene lanolin derivative, ethylene oxide derivative of alkylphenol/formalin condensate, polyoxyethylene/poloxypropylene block copolymer, polyoxyethylene/polyoxypropylene/polyoxyethylene triblock copolymer, polyoxyethylene polyoxypropylene alkyl ether and the like; ether ester type nonionic surfactants such as polyoxyethylene glycerine fatty acid ester, polyoxyethylene castor oil or hardened castor oil, polyoxyethylene sorbitan fatty acid ester, polyoxyethylene sorbitol fatty acid ester, polyoxyethylene fatty acid alkanolamide sulfate and the like; ester type nonionic surfactants such as polyethylene glycol fatty acid ester, ethylene glycol fatty acid ester, glycerine fatty acid ester, polyglycerine fatty acid ester, sorbitan fatty acid ester, saccharose fatty acid ester and the like; nitrogen-containing nonionic surfactants such as fatty acid alkanolamide, polyoxyethylene fatty acid amide, polyethylene alkylamine, alkyl polyether amine (e.g. hydroxyethyllaurylamine, polyethylene glycol laurylamine, polyethylene glycol alkyl (coconut)-amine, polyethylene glycol stearylamine, polyethylene glycol tallow amine, polyethylene glycol tallow propylenediamine, polyethylene glycol dioleylamine, or N-polyoxyalkylene polyalkylene polyamine) and the like; fluorine-containing surfactants such as fluoroalkyl($C_2$ to $C_{10}$)-carboxylic acid, disodium N-perfluorooctanesulfonylglutamate, sodium 3-[fluoroalkyl($C_6$–$C_{11}$)oxy]-1-alkyl ($C_3$–$C_4$)sulfonate, sodium 3-[ω-fluoroalkanoyl($C_6$–$C_8$)-N-ethylamino]-1-propanesulfonate, N-[3-(perfluorooctanesulfonamide)propyl]-N,N-dimethyl-N-carboxymethyleneammonium betaine, fluoroalkyl($C_{11}$–$C_{20}$) carboxylic acid, perfluoroalkylcarboxylic acid ($C_7$–$C_{11}$), perfluorooctanesulfonic acid diethanolamide, perfluoroalkyl ($C_4$–$C_{12}$)sulfonic acid salt (Li, K, Na or other salt), N-propyl-N-(2-hydroxyethyl)-perfluorooctanesulfonamide, perfluoroalkyl($C_6$–$C_{10}$)-sulfonamide propyltrimethylammonium salt, perfluoroalkyl($C_6$–$C_{10}$)-N-ethylsulfonylglycine salt (K or other salt), bis(N-perfluorooctylsulfonyl-N-ethylaminoethyl) phosphate, monoperfluoroalkyl($C_6$–$C_{16}$) ethyl phosphate and the like; saturated fatty acids, tallow fatty acids and slightly hydrogenated fatty acids of tallow, such as caproic acid, caprylic acid, capric acid, lauric acid, myristic acid, palmitic acid, stearic acid, behenic acid, oleic acid and the like; reactive surfactants such as sulfuric acid ester salt of polyoxyethylene allyl glycidyl nonylphenyl ether, polyoxyethylene allyl glycidyl nonylphenyl ether, polyoxyethylene nonyl propenyl phenyl ether, ammonium salt of polyoxyethylene nonyl propenyl phenyl ether sulfuric acid ester, allylated polyether (e.g. polyethylene glycol polypropylene glycol allyl ether or butoxypolyethylene glycol polypropylene glycol allyl ether) and the like; unsaturated fatty acids such as castor bean hardened fatty acid (12-hydroxystearic acid), erucic acid, soybean fatty acid for coating, palmitoleic acid, oleic acid, linoleic acid, α-linolenic acid, γ-linolenic acid and the like; aliphatic primary amines such as laurylamine, alkyl(coconut)amine, myristylamine, cetylamine, stearylamine, alkyl(hardened tallow)amine, alkyl(tallow)amine, oleylamine, alkyl (soybean)amine and the like; aliphatic secondary amines such as dioleylamine and the like; aliphatic tertiary amines such as dimethyllaurylamine, dimethylalkyl(coconut)amine, dimethylalkyl(hardened tallow)amine and the like; and aliphatic diamines such as alkyl(hardened tallow) propylenediamine, alkyl(tallow)propylenediamine, oleylpropylenediamine, 1,12-diaminododecane and the like. The component (A) is not restricted to these examples. These compounds may be used in admixture of two or more kinds.

In using a reactive surfactant, a polymerization initiator may be added if necessary.

As examples of the heat-resistant resin (B) having a glass transition temperature higher than the thermal decomposition temperature of the compound (A), or the heat-resistant resin precursor (B) capable of forming such a heat-resistant resin by thermal reaction or chemical ring closure, there can be mentioned polyimide resin, polyamic acid, polyamic acid ester, polyhydroxyimide resin, polyhydroxyamic acid, polyhydroxyamic acid ester, polyisoimide, polyamideimide resin, polyamide resin, bismaleimide resin, polybenzoxazole resin, polyhydroxyamide and polybenzothiazole resin. The component (B) is not restricted to these examples. Of these, preferred are polyimide resin, polyamic acid, polyamic acid ester, polyisoimide, polybenzoxazole resin, polyhydroxyamide, polyhydroxyimide resin, polyhydroxyamic acid and polyhydroxyamic acid ester because of high heat resistance.

The resin composition for insulating material according to the present invention may contain a solvent. Preferable examples of the solvent are N,N-dimethylacetamide, N-methyl-2-pyrrolidone, tetrahydrofuran, propylene glycol monomethyl ether, propylene glycol monomethyl ether acetate, diethylene glycol monomethyl ether, γ-butyrolactone, dimethylpropylene urea, cyclohexanone, cyclopentanone, butyl acetate, methyl isobutyl ketone, ethyl carbitol and diethylene glycol dimethyl ether. The solvent is not restricted to these. These solvents may be used in a mixture of two or more kinds. The present resin composition may further contain other additives in small amounts in order to allow the composition to have improved coatability or impregnatability.

The fine pores formed in the present insulating material to obtain a lower dielectric constant have diameters of 50 nm or less, preferably 10 nm or less. The proportion of the fine pores is preferably 5 to 90% by volume, more preferably 10 to 70% by volume relative to the total of the insulating material formed. When the proportion of the fine pores is smaller than the above lower value, no effect of reduction in dielectric constant is obtained. When the proportion is larger than the above upper value, the resulting insulating material has low mechanical strength.

In obtaining the resin composition for insulating material according to the present invention, the individual components are uniformly mixed in such proportions as pores are formed as mentioned above when the composition is made into the present insulating material. The proportions are such that the weight ratio of the component (A) and the component (B) is preferably 5/95 to 90/10, more preferably 10/90 to 70/30.

The insulating material of the present invention is produced, for example, by dissolving the resin composition for insulating material according to the present invention, in the above-mentioned solvent to obtain a varnish and then coating the varnish on an appropriate substrate, for example, a glass, a metal, a silicon wafer or a ceramic substrate, to form a coating film. As specific methods for coating, there can be mentioned, for example, spin coating using a spinner, spray coating using a spray coater, dipping, printing and roll coating. The thus-formed coating film is dried thermally and then heated by the above-mentioned method (fine pores are formed thereby) and cured, whereby an insulating film of low dielectric constant can be formed. The above heating and curing is preferably conducted in a heating apparatus capable of discharging the vaporized component.

DESCRIPTION OF PREFERRED EMBODIMENTS

The present invention is specifically described below by Examples. However, the present invention is in no way restricted by these Examples.

EXAMPLE 1

(1) Synthesis of Polyimide Resin 5.18 g (0.01 mole) of 2,2-bis(4-(4'-aminophenoxy)phenyl)hexafluoropropane and 9.60 g (0.03 mole) of 2,2'-bis(trifluoromethyl)-4,4'-diaminobiphenyl were dissolved in 200 g of dry N-methyl-2-pyrrolidone (hereinafter abbreviated as NMP) in a separable flask provided with a stirrer, a nitrogen inlet tube and a raw material inlet. The solution was cooled to 10° C. in dried nitrogen. Thereto were added 2.94 g (0.01 mole) of 3,3',4,4'-biphenyltetracarboxylic acid dianhydride and 13.32 g (0.03 mole) of 2,2-bis(3,4-anhydrodicarboxyphenyl)hexafluoropropane. After 5 hours from the addition, the mixture was returned to room temperature and stirred at that temperature for 2 hours to obtain a solution of a polyamic acid (a polyimide precursor).

To this polyamic acid solution was added 50 g of pyridine. Thereto was dropwise added 5.1 g (0.05 mole) of acetic anhydride, and imidization was conducted for 7 hours with the system temperature being kept at 70° C.

The reaction mixture was dropwise added to water of 20-fold volume. The resulting precipitate was recovered and vacuum-dried at 60° C. for 72 hours to obtain a solid polyimide resin (a heat-resistant resin). The polyimide resin had a number-average molecular weight of 26,000 and a weight-average molecular weight of 54,000.

(2) Measurement of Glass Transition Temperature of Heat-resistant Resin 5.0 g of the polyimide resin synthesized above was dissolved in 15.0 g of NMP. The resulting varnish was coated on a glass substrate subjected to a treatment for easy release. The coated substrate was kept in an oven at 120° C. for 30 minutes and at 230° C. for 90 minutes for film formation. The film formed was peeled from the substrate and then heated at 400° C. for 90 minutes, whereby a polyimide resin film was obtained. The polyimide resin was measured for glass transition temperature by a differential scanning calorimeter and the temperature was 335° C.

(3) Measurement of Thermal Decomposition Temperature of Compound having Amphipatic Property A polyoxyethylene olein ether [hydrophile-lipophile balance (hereinafter abbreviated as H.L.B.)=8](Noigen ET-80E, a product of Daiichi Kogyo Seiyaku Co., Ltd.) was measured for thermal decomposition temperature in a nitrogen atmosphere by thermogravimetric analysis and the temperature was 250° C.

(4) Preparation of Resin Composition for Insulating Material and Production of Insulating Material 10.0 g of the polyimide resin synthesized above was dissolved in 50.0 g of NMP. To the solution was added 5.0 g of the above polyoxyethylene olein ether. The mixture was uniformly mixed with stirring, to obtain a resin composition for insulating material.

The resin composition for insulating material was spin-coated on a silicon wafer having a tantalum film (thickness: 200 nm) formed thereon. The coated wafer was placed in an oven containing a nitrogen atmosphere to heat-cure the resin composition coated on the wafer. The heating treatment was conducted by keeping the coated wafer at 120° C. for 30 minutes, at 230° C. for 120 minutes and at 315° C. for 180 minutes in this order, raising the temperature to slightly below 335° C., then lowering the temperature to 200° C. in 15 minutes, and returning the temperature to room temperature in 60 minutes. Thus, an insulating material film having a thickness of 0.8 $\mu$m was obtained. On this insulating material film was formed an aluminum electrode having an area of 0.1 $cm^2$, by vapor deposition. A capacitance between this electrode and the tantalum of the substrate was measured using a LCR meter. From the film thickness, the electrode area and the capacitance was calculated the dielectric constant of the insulating material film, which was 2.4. The section of the insulating material film was observed using a TEM; as a result, the pores formed had an average pore diameter of 9 nm and were discontinuous.

EXAMPLE 2

(1) Synthesis of Polyimide Precursor

A solution of a polyamic acid (a polyimide precursor) was obtained in the same manner as in Example 1 except that 5.18 g (0.01 mole) of 2,2-bis(4-(4'-aminophenoxy)phenyl)hexafluoropropane and 9.60 g (0.03 mole) of 2,2'-bis(trifluoromethyl)-4,4'-diaminobiphenyl, both used in the synthesis of polyimide precursor in Example 1 were changed to 8.01 g (0.04 mole) of 4,4'-diaminodiphenyl ether and that 2.94 g (0.01 mole) of 3,3',4,4'-biphenyltetracarboxylic acid dianhydride and 13.32 g (0.03 mole) of 2,2-bis(3,4-anhydrodicarboxyphenyl)hexafluoropropane, both used also in the synthesis of polyimide precursor in Example 1 were changed to 8.72 g (0.04 mole) of pyromellitic dianhydride. The solution was dropwise added to water of 20-fold volume. The resulting precipitate was recovered and vacuum-dried at 25° C. for 72 hours to obtain a solid polyamic acid (a polyimide resin precursor). The polyamic acid had a number-average molecular weight of 27,000 and a weight-average molecular weight of 55,000.

(2) Measurement of Glass Transition Temperature of Heat-resistant Resin 5.0 g of the polyamic acid synthesized above was dissolved in 20.0 g of NMP. The resulting varnish was coated on a glass substrate subjected to a treatment for easy release. The coated substrate was kept in an oven at 120° C. for 30 minutes and at 250° C. for 90 minutes for film formation. The film formed was peeled from the substrate and then heated at 450° C. for 90 minutes, whereby a film of a heat-resistant polyimide resin was obtained. The polyimide resin was measured for glass transition temperature by a differential scanning calorimeter and the temperature was 419° C.

(3) Measurement of Thermal Decomposition Temperature of Compound having Amphipatic Property An N-polyoxyalkylene polyalkylene polyamine (molecular weight=about 20,000; H.L.B=9) (N-509, a product of Daiichi Kogyo Seiyaku Co., Ltd.) was measured for thermal decomposition temperature in a nitrogen atmosphere by thermogravimetric analysis and the temperature was 364° C.

(4) Preparation of Resin Composition for Insulating Material and Production of Insulating Material 10.0 g of the polyamic acid synthesized above was dissolved in 50.0 g of NMP. To the solution was added 8 g of the above surfactant. The mixture was uniformly mixed with stirring, to obtain a resin composition for insulating material.

The resin composition for insulating material was spin-coated on a silicon wafer having a tantalum film (thickness: 200 nm) formed thereon. The coated wafer was placed in an oven containing a nitrogen atmosphere to heat-cure the resin composition coated on the wafer. The heating treatment was conducted by keeping the coated wafer at 120° C. for 30 minutes, at 260° C. for 120 minutes and at 400° C. for 90 minutes in this order, then lowering the temperature to 200° C. in 20 minutes, and returning the temperature to room temperature in 40 minutes. Thus, an insulating material film having a thickness of 0.7 μm was obtained. The insulating material film was measured for dielectric constant in the same manner as in Example 1, which was 2.4. The section of the insulating material film was observed using a TEM; as a result, the pores formed had an average pore diameter of 8 nm and were discontinuous.

EXAMPLE 3

(1) Synthesis of Polybenzoxazole Resin

In a reactor were placed 25 g of 2,2-bis(4-carboxyhydroxyphenyl)hexafluoropropane, 45 ml of thionyl chloride and 0.5 ml of dried dimethylformamide. The mixture was subjected to a reaction at 60° C. for 2 hours. After the completion of the reaction, excessive thionyl chloride was removed by distillation with heating under reduced pressure. The resulting residue was recrystallized from hexane to obtain 2,2-bis(4-chlorobenzoyl)hexafluoro-propane.

7.32 g (0.02 mole) of 2,2-bis(3-amino-4-hydroxyphenyl) hexafluoropropane was dissolved in 100 g of dried dimethylacetamide in a separable flask provided with a stirrer, a nitrogen inlet tube and a dropping funnel. To the solution was added 3.96 g (0.05 mole) of pyridine. thereto was dropwise added, at −15° C. over 30 minutes while dried nitrogen was being introduced, a solution of 8.58 g (0.02 mole) of the above-obtained 2,2-bis(4-chlorobenzoyl) hexafluoropropane dissolved in 50 g of dimethylacetamide. After the completion of the dropwise addition, the mixture was returned to room temperature and stirred at that temperature for 5 hours. The reaction mixture was dropwise added to 1,000 ml of water. The resulting precipitate was collected and vacuum-dried at 40° C. for 48 hours to obtain a solid polyhydroxyamide (a polybenzoxazole precursor).

This polyhydroxyamide was dissolved in 200 g of NMP. To the solution was added 50 g of pyridine. Thereto was dropwise added 3.1 g (0.03 mole) of acetic anhydride, and a reaction for conversion to oxazole was conducted for 7 hours with the system temperature being kept at 70° C.

The reaction mixture was dropwise added to water of 20-fold volume. The resulting precipitate was recovered and vacuum-dried at 60° C. for 72 hours to obtain a solid polybenzoxazole resin (a heat-resistant resin). The polybenzoxazole resin had a number-average molecular weight of 20,000 and a weight-average molecular weight of 40,000.

(2) Measurement of Glass Transition Temperature of Heat-resistant Resin 5.0 g of the polybenzoxazole resin synthesized above was dissolved in a solvent mixture of 8.0 g of NMP and 12.0 g of tetrahydrofuran. The resulting varnish was coated on a glass substrate subjected to a treatment for easy release. The coated substrate was kept in an oven at 120° C. for 30 minutes and at 240° C. for 90 minutes for film formation. The film formed was peeled from the substrate and then heated at 400° C. for 90 minutes, whereby a film of a polybenzoxazole resin (a heat-resistant resin) was obtained. The polybenzoxazole resin was measured for glass transition temperature by a differential scanning calorimeter and the temperature was 362° C.

(3) Measurement of Thermal Decomposition Temperature of Compound having Amphipathic Property A polyoxyethylene nonylphenol (H.L.B.=9) (NOIGEN EA-80E, a product of Daiichi Kogyo Seiyaku Co., Ltd.) was measured for thermal decomposition temperature in a nitrogen atmosphere by thermogravimetric analysis and the temperature was 310° C.

(4) Preparation of Resin Composition for Insulating Material and Production of Insulating Material 5.0 g of the polybenzoxazole resin synthesized above was dissolved in a mixed solvent consisting of 8.0 g of NMP and 12.0 g of tetrahydrofuran. To the solution was added 4.0 g of the above surfactant. The mixture was uniformly mixed with stirring, to obtain a resin composition for insulating material.

The resin composition for insulating material was spin-coated on a silicon wafer having a tantalum film (thickness: 200 nm) formed thereon. The coated wafer was placed in an oven containing a nitrogen atmosphere to heat-cure the resin composition coated on the wafer. The heating treatment was conducted by keeping the coated wafer at 120° C. for 30 minutes, at 260° C. for 120 minutes and at 350° C. for 90 minutes in this order, then lowering the temperature to 200° C. in 15 minutes, and returning the temperature to room temperature in 40 minutes. Thus, an insulating material film having a thickness of 0.7 μm was obtained. The insulating material film was measured for dielectric constant in the same manner as in Example 1, which was 2.1. The section of the insulating material film was observed using a TEM; as a result, the pores formed had an average pore diameter of 6 nm and were discontinuous.

EXAMPLE 4

(1) Synthesis of Polyhydroxyamide

In a reactor were placed 22 g of 2,2'-bis(trifluoromethyl) biphenyl-4,4'-dicarboxylic acid, 45 ml of thionyl chloride and 0.5 ml of dried dimethylformamide. The mixture was subjected to a reaction at 60° C. for 2 hours. After the completion of the reaction, excessive thionyl chloride was removed by distillation with heating under reduced pressure. The resulting residue was recrystallized from hexane to obtain 2,2'-bis(trifluoromethyl)biphenyl4,4'-dicarboxylic acid chloride.

7.32 g (0.02 mole) of 2,2-bis(3-amino-4-hydroxyphenyl) hexafluoropropane was dissolved in 100 g of dried dimethylacetamide in a separable flask provided with a stirrer, a nitrogen inlet tube and a dropping funnel. To the solution was added 3.96 g (0.05 mole) of pyridine. Thereto was dropwise added, at −15° C. over 30 minutes while dried nitrogen was being introduced, a solution of 8.30 g (0.02 mole) of the above-obtained 2,2'-bis(trifluoroethyl) biphenyl-4,4'-dicarboxylic acid chloride dissolved in 50 g of dimethylacetamide. After the completion of the dropwise addition, the mixture was returned to room temperature and stirred at that temperature for 5 hours. The reaction mixture was dropwise added to 1,000 ml of water. The resulting precipitate was collected and vacuum-dried at 40° C. for 48 hours to obtain a solid polyhydroxyamide (a polybenzoxazole precursor). The polyhydroxyamide had a number-average molecular weight of 20,000 and a weight-average molecular weight of 40,000.

(2) Measurement of Glass Transition Temperature of Heat-resistant Resin 5.0 g of the polyhydroxyamide synthesized above was dissolved in 20.0 g of NMP. The resulting varnish was coated on a glass substrate subjected to a treatment for easy release. The coated substrate was kept in an oven at 120° C. for 30 minutes and at 240° C. for 90 minutes for film formation. The film formed was peeled from the substrate and then heated at 400° C. for 90 minutes, whereby a film of a heat-resistant polybenzoxazole was obtained. The polybenzoxazole was measured for glass transition temperature by a differential scanning calorimeter and the temperature was 410° C.

(3) Measurement of Thermal Decomposition Temperature of Compound having Amphipathic Property A polyethylene glycol stearylamine (NYMEEN S-210, a product of NOF CORP.) was measured for thermal decomposition temperature in a nitrogen atmosphere by thermogravimetric analysis and the temperature was 372° C.

(4) Preparation of Resin Composition for Insulating Material and Production of Insulating Material 10.0 g of the polyhydroxyamide synthesized above was dissolved in 50.0 g of NMP. To the solution was added 8.0 g of the above polyethylene glycol stearylamine. The mixture was uniformly mixed with stirring, to obtain a resin composition for insulating material.

The resin composition for insulating material was spin-coated on a silicon wafer having a tantalum film (thickness: 200 nm) formed thereon. The coated wafer was placed in an oven containing a nitrogen atmosphere to heat-cure the resin composition coated on the wafer. The heating treatment was conducted by keeping the coated wafer at 120° C. for 30 minutes, at 260° C. for 120 minutes and at 400° C. for 90 minutes in this order, then lowering the temperature to 200° C. in 20 minutes, and returning the temperature to room temperature in 40 minutes. Thus, an insulating material film having a thickness of 0.7 μm was obtained. The insulating material film was measured for dielectric constant in the same manner as in Example 1, which was 2.1. The section of the insulating material film was observed using a TEM; as a result, the pores formed had an average pore diameter of 5 nm and were discontinuous.

COMPARATIVE EXAMPLE 1

Preparation of a resin composition for insulating material and production of an insulating material were conducted in the same manner as in Example 4 except that the polyethylene glycol stearylamine used as a surfactant in the preparation of a resin composition for insulating material in Example 4 was not used. The insulating material film obtained had a dielectric constant of 2.6.

COMPARATIVE EXAMPLE 2

Preparation of a resin composition for insulating material and production of an insulating material were conducted in the same manner as in Example 4 except that the polyethylene glycol stearylamine (8.0 g) used in the preparation of a resin composition for insulating material in Example 4 was changed to 8 g of a polyethylene glycol having a molecular weight of 1,000. The insulating material film obtained had a dielectric constant of 2.6. No pore was observed.

COMPARATIVE EXAMPLE 3

Preparation of a resin composition for insulating material and production of an insulating material were conducted in the same manner as in Example 4 except that the polyhydroxyamide (a polybenzoxazole precursor) used in the preparation of a resin composition for insulating material in Example 4 was changed to the polybenzoxazole resin having a glass transition temperature of 362° C., obtained in Example 3. The insulating material film obtained had a dielectric constant of 2.6. No pore was observed.

In each of Examples 1 to 4, an insulating material having a very low dielectric constant of 2.1 to 2.4 could be obtained.

In Comparative Example 1, the resin composition contained no compound (A) having an amphipathic activity and, therefore, no low dielectric constant could be achieved.

In Comparative Example 2, the polyethylene glycol added had no amphipathic property and, therefore no low dielectric constant could be achieved.

In Comparative Example 3, the glass transition temperature of the heat-resistant resin was lower than the thermal decomposition temperature of the compound (A) and, therefore, no low dielectric constant could be achieved.

Thus, the resin composition for insulating material according to the present invention and an insulating material produced therefrom are superior in electrical properties (particularly, dielectric property) and heat resistance, and are useful in various fields requiring the above properties, such as interlayer dielectric for semiconductor, interlayer dielectric for multilayered circuit, and the like.

What is claimed is:

1. A resin composition for insulating material, consisting essentially of:

(A) a compound having an amphipathic property, and (B) a heat-resistant resin having a glass transition temperature higher than thermal decomposition temperature of the compound (A), or precursor thereof, wherein the compound (A) can give rise to phase separation against the heat-resistant resin or the pre-cursor thereof at a temperature lower than the thermal decomposition temperature of the compound (A) and can be thermally decomposed at a temperature not lower than the thermal decomposition temperature of the compound (A).

2. A resin composition for insulating material according to claim 1, wherein the heat-resistant resin or the precursor thereof (B) is a polyimide resin or a polyimide precursor.

3. A resin composition for insulating material according to claim 1, wherein the heat-resistant resin or the precursor thereof (B) is a polybenzoxazole resin or a polybenzoxazole precursor.

4. An insulating material produced by a process which comprises the steps of:

allowing, in the resin composition for insulating material as set forth in claim 1, the compound (A) and the heat-resistant resin or the precursor thereof (B) to form a structure of separated phases, and then heat-treating the resulting resin composition at a temperature higher than thermal decomposition temperature of the compound (A) but lower than the glass transition temperature of the heat-resistant resin (B) or the heat-resistant resin obtained by ring closure of the precursor thereof (B).

5. An insulating material produced by a process which comprises the steps of:

allowing, in the resin composition for insulating material as set forth in claim 2, the compound (A) and the heat-resistant resin or the precursor thereof (B) to form a structure of separated phases, and then heat-treating the resulting resin composition at a temperature higher than thermal decomposition temperature of the compound (A) but lower than the glass transition temperature of the heat-resistant resin (B) or the heat-resistant resin obtained by ring closure of the precursor thereof (B).

6. An insulating material produced by a process which comprises the steps of:

allowing, in the resin composition for insulating material as set forth in claim 3, the compound (A) and the heat-resistant resin or the precursor thereof (B) to form a structure of separated phases, and then heat-treating the resulting resin composition at a temperature higher than thermal decomposition temperature of the compound (A) but lower than the glass transition temperature of the heat-resistant resin (B) or the heat-resistant resin obtained by ring closure of the precursor thereof (B).

7. A resin composition for insulating material, comprising, as essential components:

(A) a compound having an amphipathic property, and (B) a heat-resistant resin having a glass transition temperature higher than thermal decomposition temperature of the compound (A), or precursor thereof, wherein the compound (A) can give rise to phase separation against the heat-resistant resin or the pre-cursor thereof at a temperature lower than the thermal decomposition temperature of the compound (A) and can be thermally decomposed at a temperature not lower than the thermal decomposition temperature of the compound (A).

* * * * *